United States Patent
Mihnea et al.

(10) Patent No.: US 7,952,936 B2
(45) Date of Patent: May 31, 2011

(54) PROGRAM-VERIFY METHOD

(75) Inventors: Andrei Mihnea, Boise, ID (US); Todd Marquart, Boise, ID (US); Jeffrey Kessenich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/606,828

(22) Filed: Oct. 27, 2009

(65) Prior Publication Data

US 2010/0046303 A1 Feb. 25, 2010

Related U.S. Application Data

(63) Continuation of application No. 11/821,914, filed on Jun. 26, 2007, now Pat. No. 7,619,931.

(51) Int. Cl.
*G11C 16/06* (2006.01)

(52) U.S. Cl. ......... 365/185.22; 365/185.03; 365/185.21; 365/189.04

(58) Field of Classification Search ............. 365/185.22, 365/185.03, 185.21, 189.04
See application file for complete search history.

(56) References Cited

U.S. PATENT DOCUMENTS

| | | | |
|---|---|---|---|
| 6,272,047 B1 | 8/2001 | Mihnea | |
| 6,384,045 B1 | 5/2002 | Hua | |
| 6,384,447 B2 | 5/2002 | Mihnea | |
| 6,434,045 B2 | 8/2002 | Mihnea | |
| 6,445,619 B1 | 9/2002 | Mihnea | |
| 6,445,620 B2 | 9/2002 | Mihnea | |
| 6,449,189 B2 | 9/2002 | Mihnea | |
| 6,563,741 B2 | 5/2003 | Mihnea | |
| 6,577,537 B2 | 6/2003 | Mihnea | |
| 6,587,376 B2 | 7/2003 | Mihnea | |
| 6,795,348 B2 | 9/2004 | Mihnea | |
| 6,798,694 B2 | 9/2004 | Mihnea | |
| 6,798,699 B2 | 9/2004 | Mihnea | |
| 6,873,550 B2 | 3/2005 | Mihnea | |
| 7,038,945 B2 | 5/2006 | Kessenich | |
| 7,046,557 B2 | 5/2006 | Mihnea | |
| 7,057,932 B2 | 6/2006 | Mihnea et al. | |
| 7,068,543 B2 | 6/2006 | Mihnea et al. | |
| 7,075,831 B2 | 7/2006 | Mihnea et al. | |
| 7,075,832 B2 | 7/2006 | Mihnea et al. | |
| 7,085,170 B2 | 8/2006 | Mihnea et al. | |
| 7,088,619 B2 | 8/2006 | Mihnea | |
| 7,099,220 B2 | 8/2006 | Mihnea et al. | |
| 7,120,055 B2 | 10/2006 | Kessenich | |

(Continued)

OTHER PUBLICATIONS

Micron Technical Note Design and Use Considerations for NAND Flash Memory, TN-29-17: NAND Flash Design and Use Considerations, 2006 Micron Technology, Inc., PDF:09005aef82304877/ Source:09005aef82047d2, tn2917.fm Rev. A 8/06 EN.

(Continued)

*Primary Examiner* — Thong Q Le
(74) *Attorney, Agent, or Firm* — Fletcher Yoder P.C.

(57) ABSTRACT

Methods and devices are disclosed, some such methods comprising applying a verify pass-through voltage to unselected select lines of the floating-gate memory array that is greater than a read pass-through voltage applied to the unselected select lines. Other methods involve utilizing a cell current for reading a value from one or more memory cells in program-verify operations that is lower than a cell current for reading the value from the one or more memory cells in read operations.

19 Claims, 7 Drawing Sheets

U.S. PATENT DOCUMENTS

| | | |
|---|---|---|
| 7,200,048 B2 | 4/2007 | Mihnea et al. |
| 7,203,098 B2 | 4/2007 | Mihnea et al. |
| 7,212,435 B2 | 5/2007 | Rudeck et al. |
| 7,215,571 B2 | 5/2007 | Mihnea et al. |
| 7,215,572 B2 | 5/2007 | Mihnea et al. |
| 7,257,024 B2 | 8/2007 | Rudeck |
| 7,259,996 B2 | 8/2007 | Mihnea |
| 7,272,039 B2 | 9/2007 | Rudeck |
| 7,272,044 B2 | 9/2007 | Mihnea |
| 7,277,326 B2 | 10/2007 | Mihnea |
| 7,277,327 B2 | 10/2007 | Mihnea |
| 7,280,403 B2 | 10/2007 | Kessenich |
| 7,292,476 B2 | 11/2007 | Goda |
| 7,301,805 B2 | 11/2007 | Gorobets et al. |
| 7,440,327 B1 | 10/2008 | Sekar et al. |
| 7,450,435 B2 | 11/2008 | Tran et al. |
| 7,492,633 B2 | 2/2009 | Mokhlesi |
| 2007/0137113 A1 | 6/2007 | Turcot |
| 2007/0211536 A1* | 9/2007 | Aritome .................. 365/185.22 |

OTHER PUBLICATIONS

Makwana & Schroder, A Nonvolatile Memory Overview, found at http://aplawrence.com/Makwana/nonvolmem.html, Mar. 27, 2007.

SST Technical Paper "Reliability Considerations for Reprogrammable Nonvolatile Memories", Nov. 2001, 2002 Silicon Storage Technology, Inc., S72021-00-000 2/02.

Shirota, Topic 222 Flash: NAND Reliability, Memory Division, Semiconductor Company, Toshiba Corporation, Tokyo, Japan, 2000.

* cited by examiner

PROGRAM-VERIFY METHOD

CROSS REFERENCE TO RELATED APPLICATION

This application is a continuation of U.S. patent application Ser. No. 11/821,914, filed on Jun. 26, 2007, and issued as U.S. Pat. No. 7,619,931 on Nov. 17, 2009, which is hereby incorporated by reference in its entirety.

BACKGROUND

1. Field of the Invention

Embodiments of the present invention relate generally to memory devices and, more specifically, in one or more embodiments, to methods of operating floating-gate memory devices to reduce problems associated with over-programmed memory cells.

2. Description of the Related Art

Processor-based systems, such as computers, typically include one or more memory devices to provide storage capability for the system. System memory is generally provided in the form of one or more devices (e.g., integrated circuit chips) and generally includes both random access memory (RAM) and read-only memory (ROM). System RAM is typically large and volatile and provides the system's main memory. Static RAM and Dynamic RAM are commonly employed types of random access memory. In contrast, system ROM is generally small and includes non-volatile memory for storing initialization routines and identification information. Electrically erasable read-only memory (EEPROM) is one commonly employed type of read-only memory, wherein an electrical charge may be used to program and/or erase data in the memory.

One type of non-volatile memory that is of particular use is a flash memory. A flash memory is a type of EEPROM that can be erased and reprogrammed in blocks. Flash memory is often employed in personal computer systems in order to store the Basic Input Output System (BIOS) program such that it can be easily updated. Flash memory is also employed in wireless electronic devices because it enables the manufacturer to support new communication protocols as they become standardized and to provide the ability to remotely upgrade the device for enhanced features.

A typical flash memory includes a memory array having a large number of memory cells arranged in rows and columns. The memory cells are generally grouped into blocks such that groups of cells can be programmed or erased simultaneously. Each of the memory cells includes a floating-gate field-effect transistor capable of holding a charge. Floating-gate memory cells differ from standard MOSFET designs in that they include an electrically isolated gate, referred to as the "floating gate," in addition to the standard control gate. The floating gate is generally formed over the channel and separated from the channel by a gate oxide. The control gate is formed directly above the floating gate and is separated from the floating gate by another dielectric layer. A floating-gate memory cell stores information by holding electrical charge within the floating gate. By adding or removing charge from the floating gate, the threshold voltage of the cell changes, thereby defining whether this memory cell is programmed or erased.

A NAND flash-memory device is a common type of flash-memory device, so called for the logical form in which the basic memory cell configuration is arranged. Typically, the array of memory cells for NAND flash-memory devices is arranged such that the control gate of each memory cell of a row of the array is connected to a "word" line. Columns of the array include strings (often termed "NAND strings") of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column "bit" line.

In operation, the word lines select the individual memory cells to be programmed or read from and operate the unselected memory cells of each string as pass transistors. In a typical programming operation, a gate programming voltage is applied to the word line connected to a control gate of the memory cell to be programmed. In addition, a program pass-through voltage is applied to the word lines connected to the control gates of unselected memory cells, so that they pass current in a manner that is unrestricted by their stored data values. To determine whether the target memory cell has been programmed to the desired state, a program-verify operation is then performed. In a typical program-verify operation, a read voltage is applied to the word line connected to the control gate of the selected memory cell. In addition, a verify pass-through voltage is applied to the word lines connected to the control gates of the unselected memory cells, so that they pass current in a manner that is unrestricted by their stored data values. Current then flows from the source line to the column bit line through each NAND string via the corresponding select gates, restricted only by the selected memory cells of each string. This places the current-encoded data values of the row of selected memory cells on the column bit lines.

Over-programming of a memory cell may occur when the threshold voltage of the memory cell goes too high. For floating-gate memory cells in particular, over-programming is generally undesirable. For instance, in program-verify operations, a pass-through voltage is applied to the control gates of unselected memory cells, so that they pass current in a manner that is unrestricted by their stored data values. However, due to its high threshold voltage, an over-programmed cell may not pass current in a manner unrestricted by its stored data value. Accordingly, the entire string containing the over-programmed cell may become non-conductive, preventing the programming of additional cells on that string and potentially resulting in a false verify being returned. In addition, if the threshold voltage of the over-programmed cell drops over time, then the threshold voltage of other cells on the same string would also appear to drop potentially causing read failures.

Embodiments of the present invention may be directed to one or more of the problems set forth above.

DETAILED DESCRIPTION OF SPECIFIC EMBODIMENTS

Figure 1:
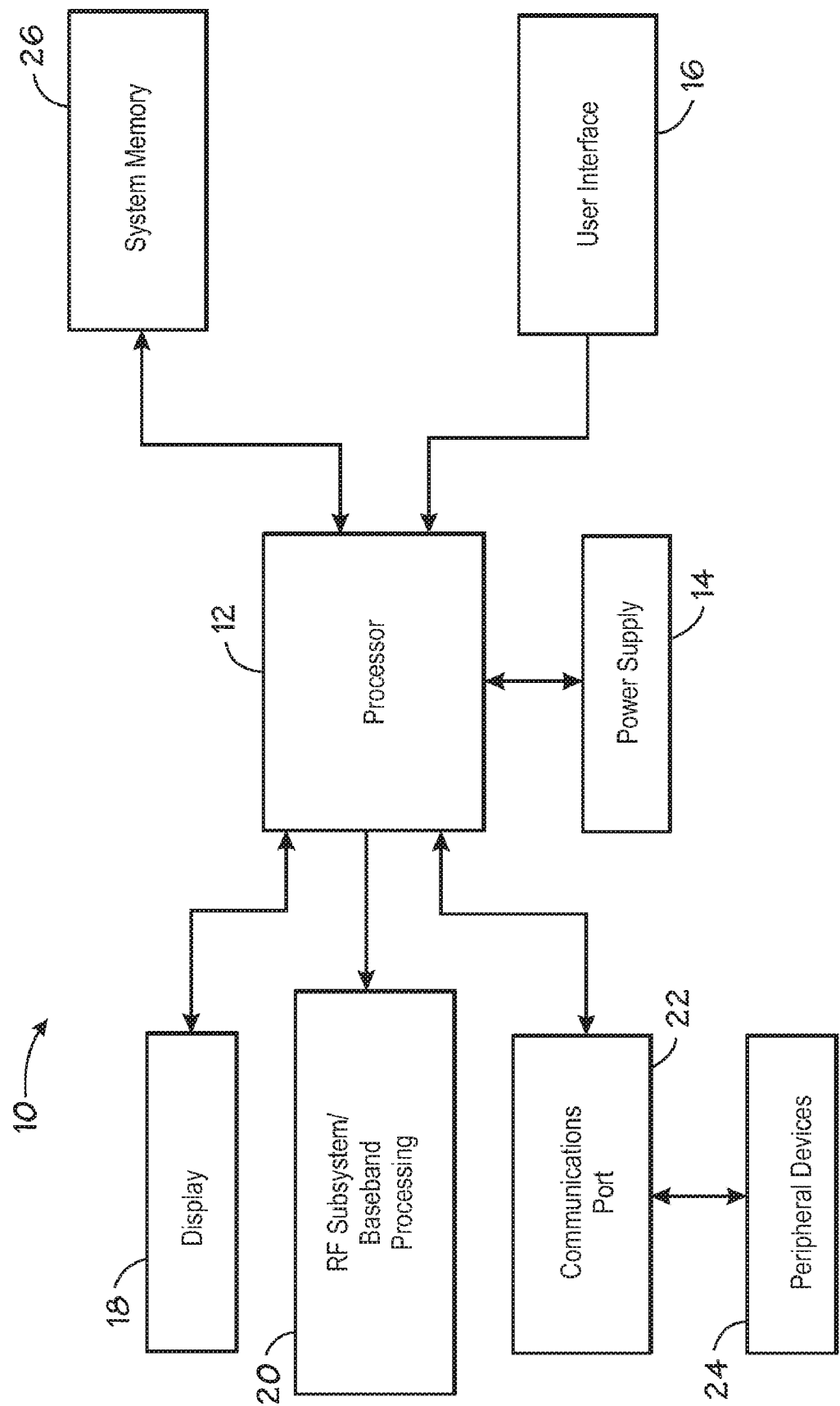
FIG. 1 illustrates a block diagram of a processor-based device having a memory that includes memory devices configured in accordance with one or more embodiments of the present invention.

Turning now to the drawings, and referring initially to FIG. 1, a block diagram depicting a processor-based system, generally designated by reference numeral 10, is illustrated. The system 10 may be any of a variety of types such as a computer, pager, cellular phone, personal organizer, control circuit, etc. In a typical processor-based system, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, the system 10 uses memory to enable the processor 12 to be efficient. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As described further below, the system memory 26 may include one or more memory devices, such as flash memory devices, that may include a floating-gate memory array fabricated in accordance with one or more embodiments of the present invention.

Figure 2:
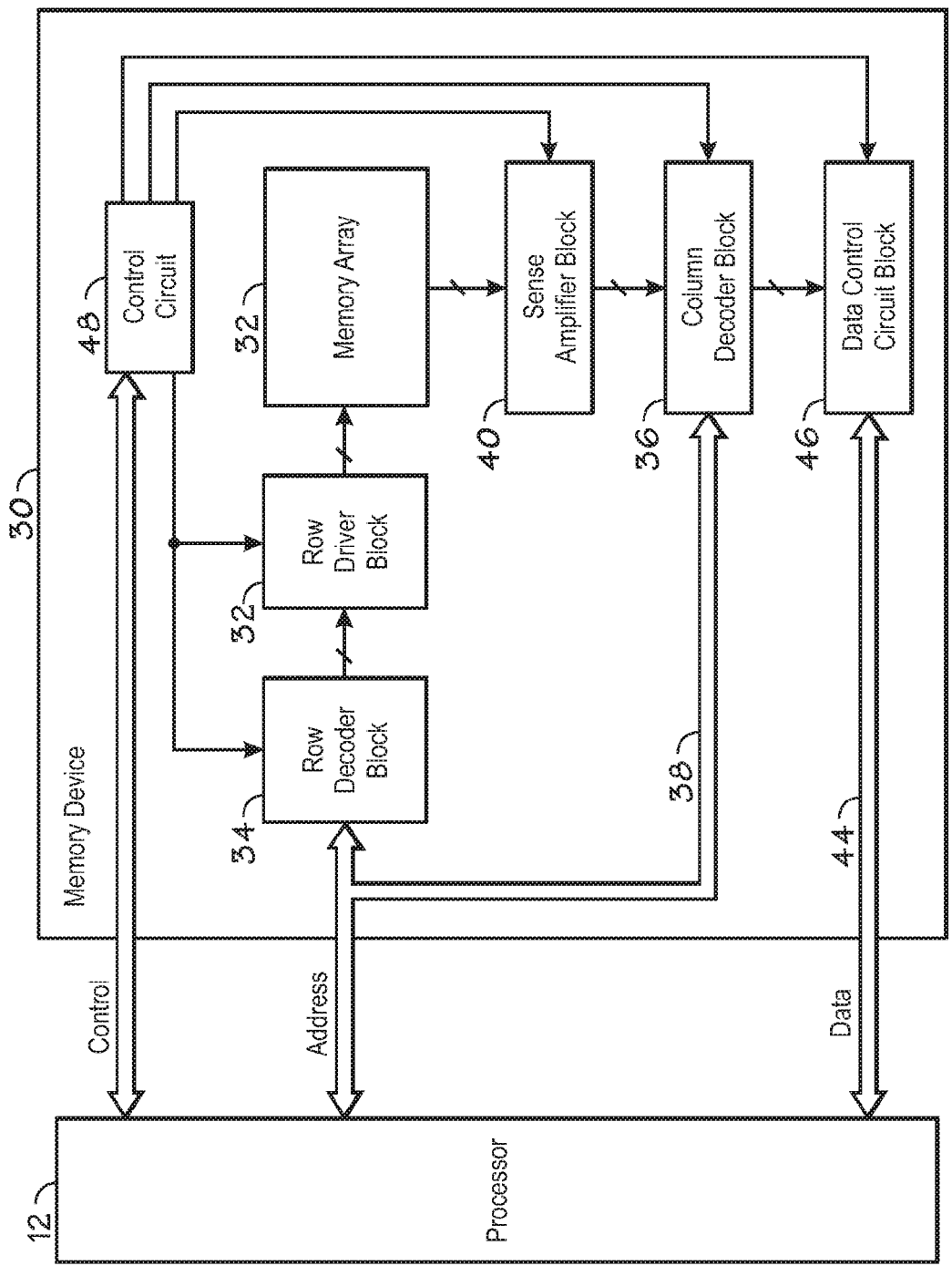
FIG. 2 illustrates a block diagram of a memory device having a memory array configured in accordance with one or more embodiments of the present invention.

FIG. 2 is a block diagram illustrating a flash memory device 30 that may be included as a portion of the system memory 26 of FIG. 1. As will be described further below with respect to FIG. 3, the flash memory device 30 may be a NAND flash memory device. The flash memory device 30 generally includes a memory array 32. The memory array 32 generally includes many rows and columns of conductive traces arranged in a grid pattern to form a number of memory cells. The lines ("select" lines) used to select a memory cell for programming or reading are generally referred to as "word lines." The lines ("access" lines) used to access a memory cell, such as for sensing, are generally referred to as "bit lines" or "digit lines." The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 to access a particular memory cell in the memory array 32. A sense amplifier block 40 having a plurality of sense amplifiers is also provided between the column decoder 36 and the memory array 32 to sense and amplify individual values stored in the memory cells. Further, a row driver block 42 is provided between the row decoder block 34 and the memory array 32 to activate selected word lines in the memory array according to a given row address.

During read and programming operations, data may be transferred to and from the flash memory device 30 via the data bus 44. The coordination of the data and address information may be conducted through a data control circuit block 46. Finally, the flash memory device 30 may include a control circuit 48 configured to receive control signals from the processor 12 via the control bus 50. The control circuit 48 is coupled to each of the row decoder block 34, the column decoder block 36, the sense amplifier block 40, the row driver block 42 and the data control circuit block 46, and is generally configured to coordinate timing and control among the various circuits in the flash memory device 30. During programming, program-verify, and read operations, the control circuit 48 is configured to control the values of voltages applied to word and bit lines. The control circuit 48 may include any suitable type of controller, including a state machine, a sequencer, etc., for example.

Figure 3:
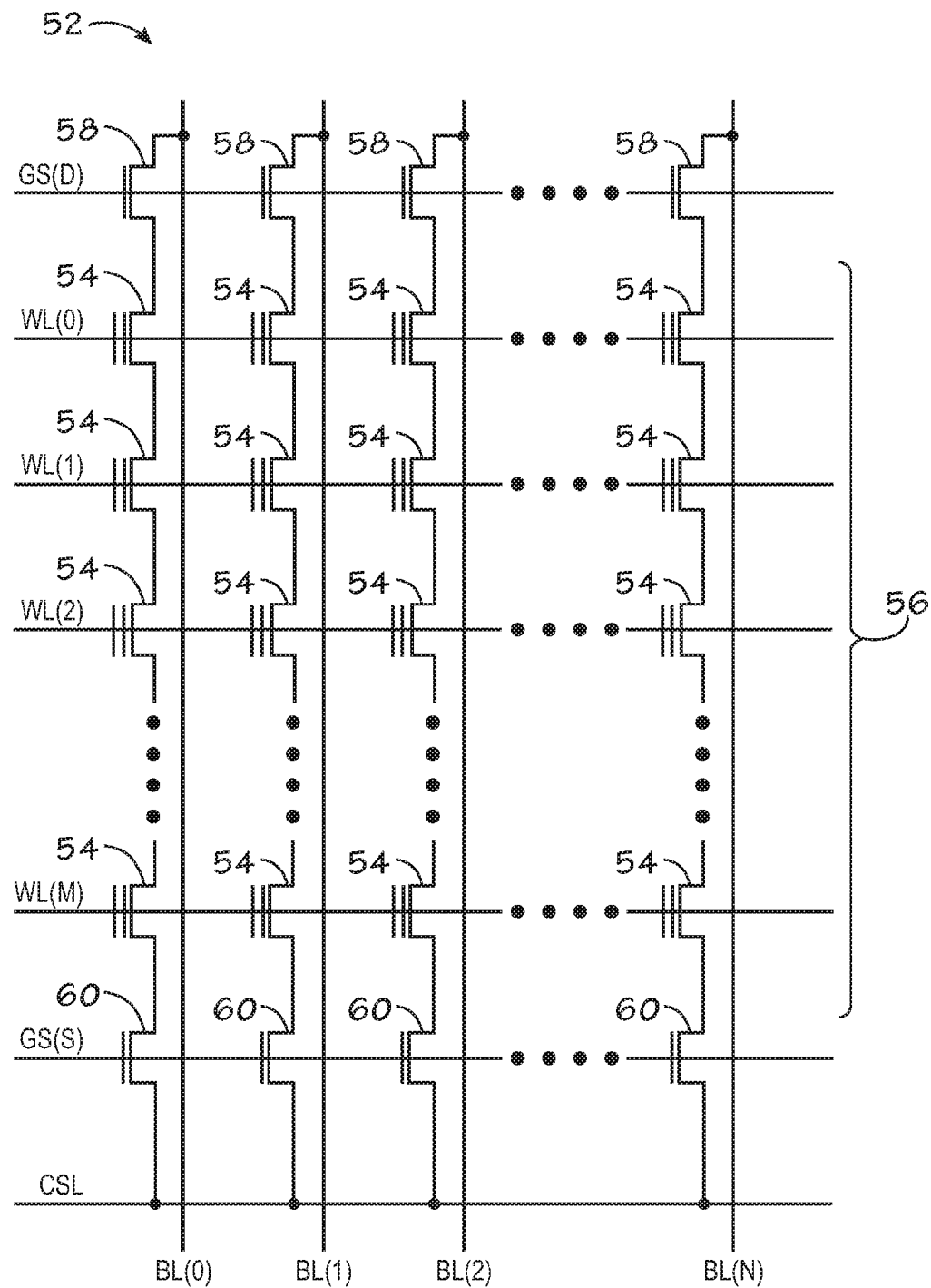
FIG. 3 is a schematic diagram of a NAND flash-memory array having memory cells configured in accordance with one or more embodiments of the present invention.

FIG. 3 illustrates an embodiment of the memory array 32, of FIG. 2. In the present embodiment, the memory array 32 comprises a NAND memory array 52. The NAND memory array 52 includes word lines WL(0)-WL(M) and intersecting local bit lines BL(0)-BL(N). The NAND strings are coupled to global bit lines (shown as BL(0)-BL(N) on FIG. 3) in a many-to-one relationship.

The NAND memory array 52 includes a floating-gate transistor 54 located at each intersection of a word line WL and a NAND string. The floating-gate transistors 54 serve as non-volatile memory cells for storage of data in the NAND memory array 52, as previously described. As will be appreciated, each floating-gate transistor includes a source, a drain, a floating gate, and a control gate. The control gate of each floating-gate transistor 54 is coupled to a respective word line WL. The floating-gate transistors 54 are connected in series, source to drain, to form a NAND string 56 formed between select gates. Specifically, the NAND strings 56 are formed between the drain select line GS(D) and the source select line GS(S). The drain select line GS(D) is coupled to each NAND string 56 through a respective drain select gate 58. Similarly, the source select line GS(S) is coupled to each NAND string 56 through a respective source select gate 60. The drain select gates 58 and the source select gates 60 may each comprise a field-effect transistor (FET), for instance. A "column" of the memory array 52 includes a NAND string 56 and the source select gate 60 and drain select gate 58 connected thereto. A "row" of the floating-gate transistors 52 are those transistors commonly coupled to a given word line WL.

The source of each source select gate 60 is connected to a common source line CSL. The drain of each source select gate 60 is coupled to the source of the first of the floating-gate transistors 54 in a respective NAND string 56. The gate of each source select gate 60 is coupled to the source select line GS(S).

The drain of each drain select gate 58 is connected to a respective global bit line BL for the corresponding NAND string 56. The source of each drain select gate 58 is connected to the drain of the last of the floating-gate transistors 54 of a respective NAND string 56. Accordingly, as illustrated in FIG. 3, each NAND string 56 is coupled between a respective drain select gate 58 and source select gate 60. The gate of each drain select gate 58 is coupled to the drain select line GS(D).

During programming of one or more of the floating-gate transistors 54 in the NAND memory array 52, the threshold voltage of one of the floating-gate transistors may go too high, which is often referred to as "over-programming." For floating-gate transistors in particular, over-programming is generally undesirable. For instance, an over-programmed transistor may not pass current in a manner unrestricted by its stored data value when a pass through voltage is applied to the control gate of that particular transistor. This may result in the entire string containing the over-programmed transistor becoming non-conductive, preventing the programming of additional transistors on that string and potentially resulting in a false verify being returned. For example, if the floating-gate transistor 54 at the intersection of word line WL(0) and bit line (0) is over-programmed, it may not properly operate as a pass-through transistor when a pass-through voltage is applied, potentially making that particular NAND string 56 non-conductive. Accordingly, in programming, program-verify, and read operations, other of the floating-gate transistors 54 on that particular NAND string 56 may not be properly verified or properly programmed. In addition, if the threshold voltage of the over-programmed transistor drops over time, the threshold voltage of the other of the floating-gate transistors 54 on that particular NAND string will also appear to drop, possibly causing failure of subsequent read operations.

One or more embodiments of the present invention provide a method for operating the memory device 30 to address problems associated with over-programming. As will be described further with respect to FIGS. 4-7, the present technique generally involves applying a voltage to unselected rows of floating-gate transistors 54 during program-verify operations, wherein the voltage is greater than a voltage applied in read operations. By application of the greater voltage, any floating-gate transistors 54 in the unselected rows should pass current in a manner that is unrestricted by their stored data values whether or not any of those transistors are over-programmed.

Figure 4:
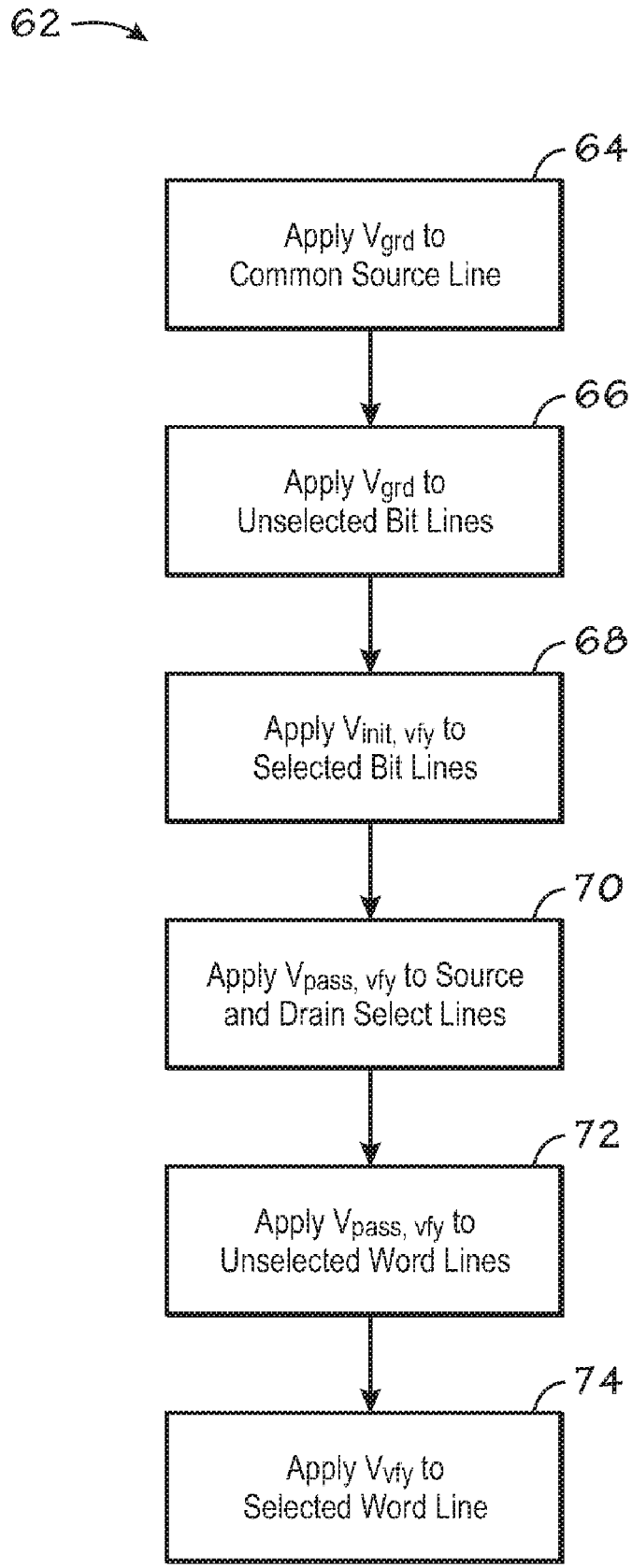
FIG. 4 is a flow chart illustrating a program-verify operation in accordance with one or more embodiments of the present invention.
Figure 5:
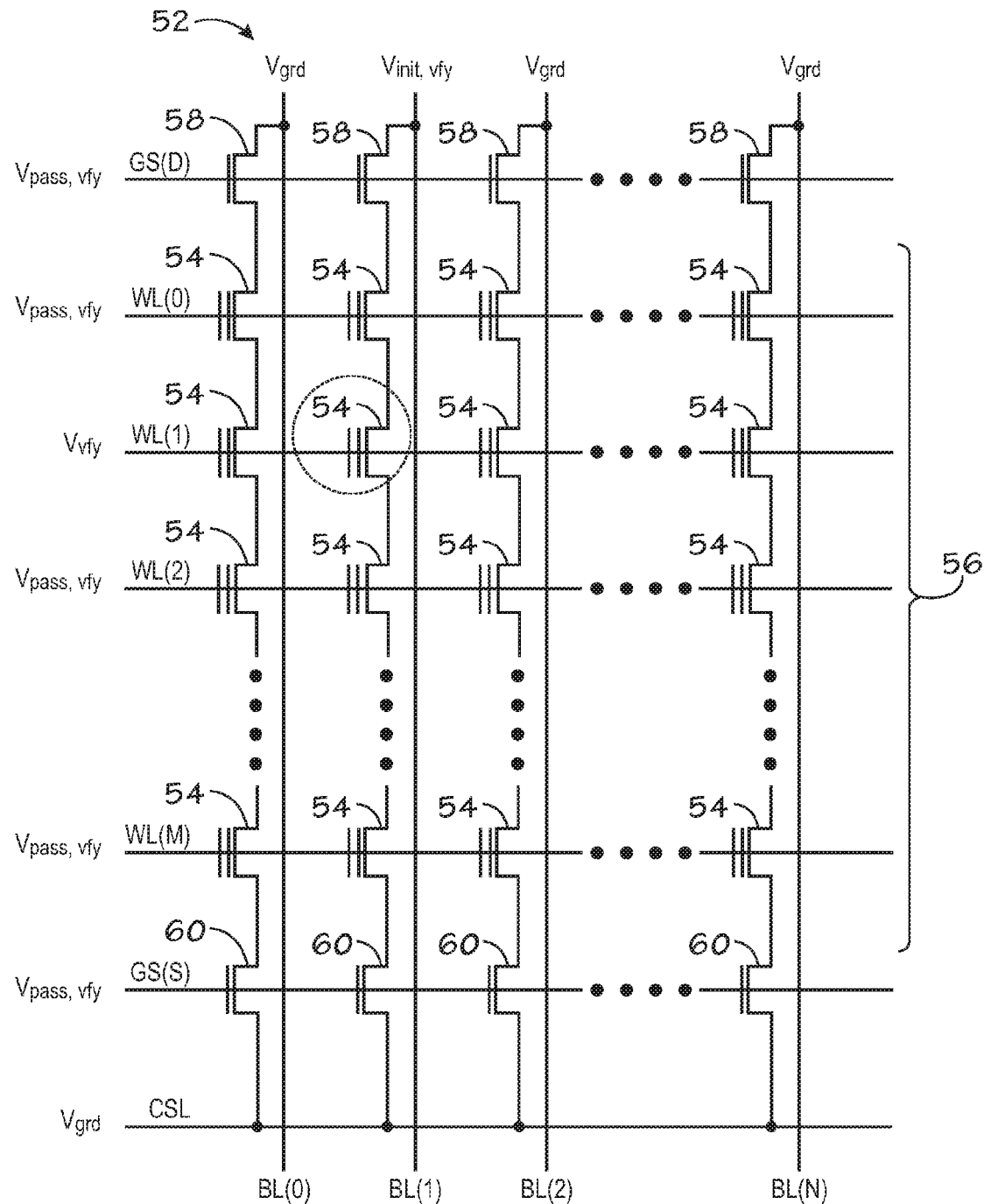
FIG. 5 is a schematic diagram of a NAND flash-memory array illustrating a program-verify operation in accordance with one or more embodiments of the present invention.

FIG. 4 illustrates a program-verify operation 62 in accordance with one embodiment of the present technique. FIG. 5 is a schematic diagram of the NAND memory array of FIG. 3 illustrating the program-verify operation 62 in accordance with one or more embodiments of the present technique. As will be appreciated, it is not intended for FIGS. 4 and 5 to imply a specific timing sequence. Further, as will be appreciated, program-verify operations are typically performed after programming of one or more floating-gate transistors to determine whether the one or more floating-gate transistors were successfully programmed to the desired state. If the particular transistor has not achieved the desired state, it will be subjected to one or more additional programming operations. Furthermore, the following description of FIGS. 4 and 5 describes the program-verify operation 62 with respect to the floating-gate transistor 54 at the intersection of word line WL(1) and bit line BL(1), as indicated by the dashed circle in FIG. 5. Those of ordinary skill in the art will appreciate, however, that the present technique may be used to verify programming of any of the floating-gate transistors 54 in the NAND memory array 52.

Referring now to FIGS. 4 and 5, to verify programming of selected floating-gate transistors (such as the floating-gate transistor 54 at the intersection of word line WL(1) and bit line BL(1)), a ground potential $V_{grd}$ is applied to the common source line CSL, as indicated in block 64. To the bit lines BL(0)-BL(N), either a bit line initial-verify voltage $V_{init, vfy}$ is applied or a ground potential $V_{grd}$ is applied. As indicated in block 66, a ground potential $V_{grd}$ is applied to the unselected bit lines (e.g., BL(0), BL(2), etc.). As indicated in block 68, a bit line initial-verify voltage $V_{init, vfy}$ is applied to selected bit lines (e.g., BL(1)). As illustrated in FIG. 5, the selected bit line BL(1) is coupled to the selected floating-gate transistor (e.g., the transistor at the intersection of BL(1) and WL(1)). While FIG. 5 illustrates the application of the bit line initial-verify voltage $V_{init, vfy}$ to one bit line, it should be noted that more than one bit line may be simultaneously selected in each program-verify operation. For example, to verify programming of multiple transistors on word line WL(1), odd order bit lines BL(1), BL(3), BL(5), etc. may be selected, while even order bit lines BL(0), BL(2), etc. are grounded.

Regarding the application of voltage to the selected bit lines (e.g., BL(1)), the selected bit lines generally undergo a transient operation during the program-verify operation 62. For example, the selected bit line BL(1) first may be pre-charged to the bit line initial-verify voltage $V_{init, vfy}$. The bit line initial-verify voltage $V_{init, vfy}$ may range from 0.3 to 1.5V, for example. Thereafter, the voltage on the selected bit line BL(1) either remains substantially the same or is discharged to a bit line final-verify voltage $V_{final, vfy}$ by the current of the selected floating-gate transistor at the intersection of bit line BL(1) and word line WL(1). If the selected floating-gate transistor is in a programmed state (e.g., a logical value of "0"), the selected bit line BL(1) should remain at the bit line initial-verify voltage $V_{init, vfy}$. If the selected floating-gate transistor is in an erased stated (e.g., a logical value of "1"), the selected bit line BL(1) should be discharged to the bit line final-verify voltage $V_{final, vfy}$. As will be appreciated, this discharge dynamic may be defined by the following equation:

$$C_{bl}(V_{init,vfy} - V_{final,vfy}) = I_{cell} t_{sense,vfy}$$

where $C_{bl}$ is the capacitance of the selected bit line;

$V_{init, vfy}$ is the initial voltage applied to the selected bit line in the program-verify operation;

$V_{final, vfy}$ is the discharge level of the selected bit line in the program-verify operation;

$I_{cell}$ is the current of the selected floating-gate transistor; and $t_{sense, vfy}$ is the time allowed for the bit-line discharge in the program-verify operation.

As will be appreciated, the bit line initial-verify voltage $V_{init, vfy}$, the bit line final-verify voltage $V_{final, vfy}$ and the verify sensing delay $t_{sense, vfy}$ are adjustable. Further, the difference between bit line initial-verify voltage $V_{init, vfy}$ and the bit line final-verify voltage $V_{final, vfy}$ (i.e., $V_{init, vfy} - V_{final, vfy}$)

for the selected bit lines (e.g., BL(1)) is generally referred to as "the range of bit line travel," and the time allowed for the bit line discharge in the program-verify operation is commonly referred as "the verify sensing delay" $t_{sense,\ vfy}$.

In accordance with certain embodiments, it may be desirable to make the program-verify operation 62 more sensitive to residual cell current than during read operations. As will be appreciated, reducing the current of the selected floating-gate transistor $I_{cell}$ necessary to read a logical value of "1" should allow programming, for example, even where an over-programmed transistor on the same string limits current on the particular string. From the above equation, the current of the selected floating-gate transistor $I_{cell}$ is directly proportional to the range of bit line travel (i.e., $V_{init,\ vfy}$–$V_{final,\ vfy}$) and inversely proportional to the sensing delay $t_{sense,\ vfy}$. Accordingly, the program-verify operation 62 may be made more sensitive to residual cell current than read operations by utilizing a lower range of bit line travel, a greater sensing delay $t_{sense,\ vfy}$, or both. As will be appreciated, the technique for making the program-verify operation 62 more sensitive to residual cell current may be used in conjunction with, or separate from, the utilization of a greater verify pass-through voltage $V_{pass,\ verify}$ in the program-verify operation 62.

In regard to utilizing a lower range of bit line travel, the current of the selected floating-gate transistor $I_{cell}$, necessary to read a logical value of "1" may be reduced by utilizing a range of bit line travel for the program-verify operation 62 that is lower than the range of bit line travel utilized during the read operations. In certain embodiments, the range of bit line travel for the program-verify operation may be at least 0.2V lower than the range of bit line travel for read operations. By way of example, if the range of bit line travel is 0.4V in the program-verify operation, then the range of bit line travel for the read operations may be 0.6V. As will be appreciated the range of bit line travel may lowered for the program-verify operation 62 by adjusting the bit line initial-verify voltage $V_{init,\ vfy}$, the bit line final-verify voltage $V_{final,\ vfy}$, the values in the read operations, or a combination thereof.

In regard to utilizing a greater sensing delay, the current of the selected floating-gate transistor $I_{cell}$ necessary to read a logical value of "1" may be reduced by utilizing a verify sensing delay $t_{sense,\ vfy}$ for the program-verify operation 62 that is greater than the read sensing delay $t_{sense,\ rd}$ utilized during the read operations. In certain embodiments, the verify sensing delay $t_{sense,\ vfy}$ may be at least 2 microseconds greater than the read sensing delay $t_{sense,\ rd}$. By way of example, if the verify sensing delay $t_{sense,\ vfy}$ is 6 microseconds, then the read sensing delay $t_{sense,\ rd}$ may be 4 microseconds.

As indicated in block 70, a verify pass-through voltage $V_{pass,\ vfy}$ is applied to the source select line GS(S) and the drain select line GS(D). Accordingly, the verify pass-through voltage $V_{pass,\ vfy}$ is applied to each source select gate 60 and each drain select gate 58. As described above, the source select gates 60 and drain select gates 58 may each comprise a FET. The verify pass-through voltage $V_{pass,\ vfy}$ should place the FET's in the source select gates 60 and the drain select gates 58 in an "on" state so that the FET's are operated as pass transistors. In general, the verify pass-through voltage $V_{pass,\ vfy}$ may range from 3 to 8V with a range of from 4.5 to 6.5V being typical. As will be appreciated, the present technique also encompasses verify pass-through voltages outside of the listed range depending, for example, on the particular application and configuration of the transistor.

As indicated in block 72, a verify pass-through voltage $V_{pass,\ vfy}$ is applied to the word lines WL(0), WL(2)-WL(M) (referred to hereafter as "the unselected word lines"). As illustrated in FIG. 5, the unselected word lines WL(0), WL(2)-WL(M) are coupled to rows of the floating-gate transistors 54 that do not contain the selected floating-gate transistors (e.g., the selected floating gate transistor 54 at the intersection of WL(1) and BL(1)). The rows of the floating-gate transistors 54 coupled to the unselected word lines WL(0), WL(2)-WL(M) will be referred to hereafter as the "unselected floating-gate transistors." Accordingly, the verify pass-through voltage $V_{pass,\ vfy}$ is applied to the control gate of the unselected floating-gate transistors through the unselected word lines WL(1), WL(2)-WL(M). The verify pass-through voltage $V_{pass,\ vfy}$ should place the unselected floating-gate transistors in an "on" state regardless of their programmed state. In other words, the unselected floating-gate transistors are operated in the program-verify operation 62 as pass transistors that pass current unrestricted by their programmed or unprogrammed threshold voltage.

As previously mentioned, if one or more of the unselected floating-gate transistors is over-programmed, then that particular transistor will have an elevated threshold voltage so that a greater verify pass-through voltage $V_{pass,\ vfy}$ would be required to operate the over-programmed transistor as a pass transistor regardless of its programmed state. Accordingly, a greater verify pass-through voltage $V_{pass,\ vfy}$ can be used in one or more embodiments of the present invention. More particularly, the verify pass-through voltage $V_{pass,\ vfy}$ utilized is greater than a read pass-through voltage $V_{pass,\ rd}$ that is applied during read operations. In this manner, the unselected floating-gate transistors should be operated during the program-verify operation as pass transistors that pass current unrestricted by their programmed state regardless of whether one of the unselected floating-gate transistors is over-programmed. In certain embodiments, the verify pass-through voltage $V_{pass,\ vfy}$ may be at least 1V greater than the read pass-through voltage $V_{pass,\ rd}$. By way of example, if the read pass-through voltage $V_{pass,\ rd}$ is 5V, then the verify pass-through voltage $V_{pass,\ vfy}$ would be 6V or even greater. In general, the verify pass-through voltage $V_{pass,\ vfy}$ may range from 3 to 8V with a range of from 4.5 to 6.5V being typical. As will be appreciated, the present technique also encompasses verify pass-through voltages outside of the listed range depending, for example, on the particular application and configuration of the transistor.

As indicated in block 74, a verify voltage $V_{vfy}$ is applied to the word line WL(1) (referred to hereafter as "the selected word line"). As illustrated, the selected word line WL(1) is coupled to the control gate of the selected floating-gate transistors, such as the floating-gate transistor 54 at the intersection of word line WL(1) and bit line BL(1). Accordingly, the verify voltage $V_{vfy}$ is applied to the control gate of each selected floating-gate transistor through the selected word line WL(1). The verify voltage $V_{vfy}$ is typically a voltage that allows the programmed state of the selected floating-gate transistors to affect the amount of current flow through the selected floating-gate transistors. For example, the verify voltage $V_{vfy}$ may range from 0 to 7V with a range from 0 to 4V being typical. As will be appreciated, the present technique also encompasses verify voltages outside of the listed range depending, for example, on the particular application and configuration of the transistor. Because the unselected floating-gate transistors are typically operated to pass current unrestricted by their programmed state, the programmed state of the selected floating-gate transistors will determine the amount of current the particular NAND memory string 56 passes from the connected bit lines (e.g., BL(0)) in the program-verify operation 62.

Figure 6:
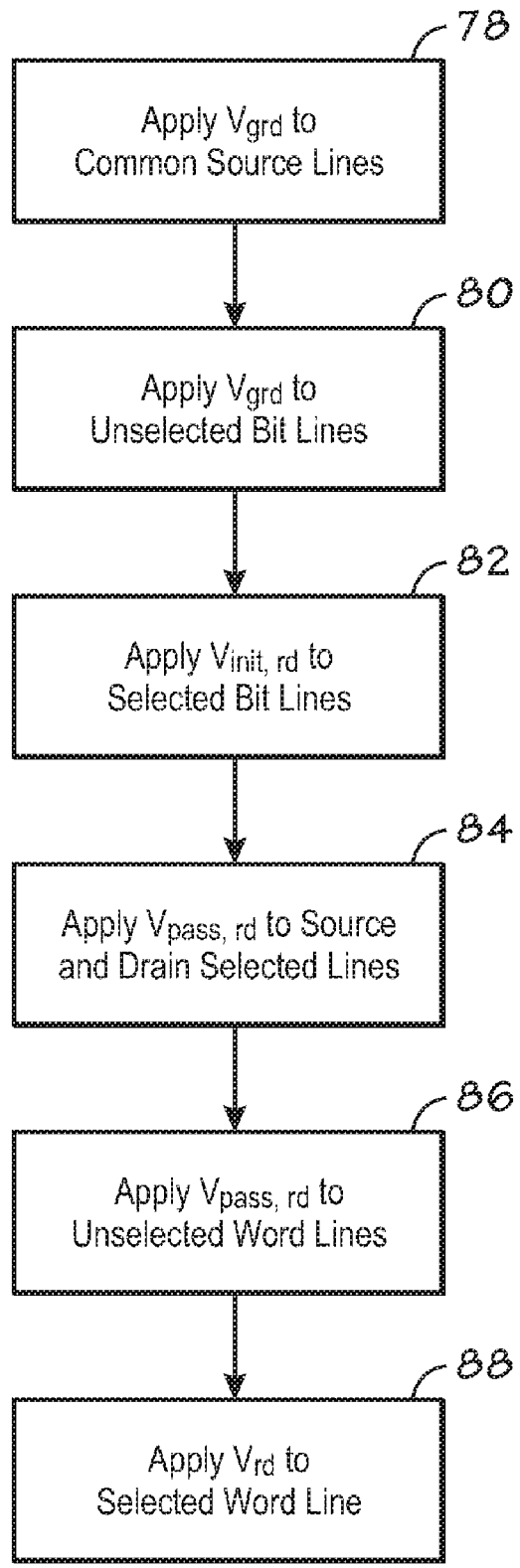
FIG. 6 is a flow chart illustrating a read operation in accordance with one or more embodiments of the present invention.
Figure 7:
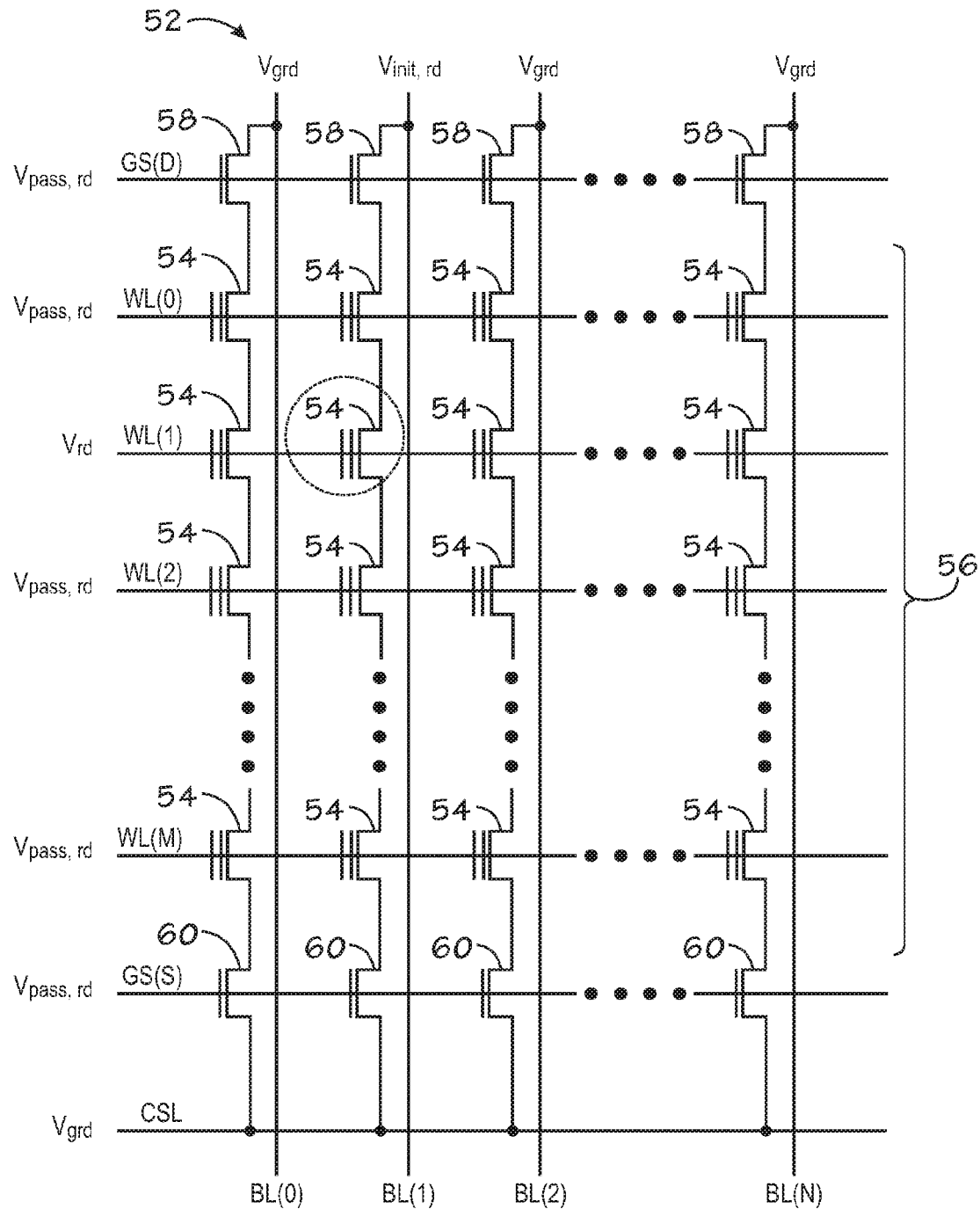
FIG. 7 is a schematic diagram of a NAND flash-memory array illustrating a read operation in accordance with one or more embodiments of the present invention.

A read operation 76 is described below with respect to FIGS. 6 and 7 in accordance with one embodiment of the present technique. FIG. 6 is a flow chart illustrating the read operation 76 in accordance with one embodiment of the present technique. FIG. 7 is a schematic diagram of the NAND memory array of FIG. 3 illustrating the read operation 76 in accordance with one or more embodiments of the present technique. As will be appreciated, it is not intended for FIGS. 6 and 7 to imply a specific timing sequence. Further, as will be appreciated, the following description of FIGS. 6 and 7 describes the read operation 76 with respect to the selected floating-gate transistor at the intersection of word line WL(1) and bit line BL(1). Those of ordinary skill in the art will appreciate, however, that the present technique may be used to read any of the floating-gate transistors 54 in the NAND memory array 52.

As will be appreciated, the read operation 76 is similar to the program-verify operation 62 described above with respect to FIGS. 4-5. However, as described above, one or more embodiments of the present technique may utilize a verify pass-through voltage $V_{pass, vfy}$ that is greater than the read pass-through voltage $V_{pass, rd}$ applied during the read operation 76. Additionally, as also described above, one or more embodiments of the present technique may make the program-verify operation 62 more sensitive to residual cell current $I_{cell}$ than the read operation 76, for example, by utilizing a range of bit line travel (i.e., $V_{init, vfy}-V_{final, vfy}$) that is lower in the program-verify operation 62 or a sense delay $t_{sense, vfy}$ that is greater in the program-verify operation 62.

Referring now to FIGS. 6 and 7, to read the selected floating-gate transistors (such as the floating-gate transistor 54 at the intersection of word line WL(1) and bit line BL(1)), a ground potential $V_{grd}$ is applied to the common source line CSL, as illustrated in block 78. To the bit lines BL(0)-BL(N), either a bit line initial-read voltage $V_{init, rd}$ is applied or a ground potential $V_{grd}$ is applied. As indicated in block 80, a ground potential $V_{grd}$ is applied to the unselected bit lines (e.g., BL(0), BL(2), etc.). As indicated in block 82, a bit line initial-read voltage $V_{init, rd}$ is applied to selected bit lines (e.g., BL(1)). As illustrated in FIG. 7, the selected bit lines BL(1) is coupled to selected floating-gate transistor at the intersection of BL(1) and WL(1). While FIG. 7 illustrates the application of the bit line initial-read voltage $V_{init, rd}$ to a single bit line, it should be noted that more than one bit line may be simultaneously selected in each single read operation. For example, to read multiple transistors on word line WL(1), odd ordered bit lines BL(1), BL(3) etc. may be selected for read, while even ordered bit lines BL(0), BL(2), etc. are grounded.

Similar to the program-verify operation 62, the application of voltage to the selected bit lines (e.g., BL(1)) during the read operation 76 is a transient operation. For example, the selected bit line BL(1) first may be pre-charged to the bit line initial-read voltage $V_{init, read}$. The bit line initial-read voltage $V_{init, rd}$ may range from 0.3 to 1.5V, for example. Thereafter, the voltage on the selected bit line BL(1) either remains substantially the same or is discharged to a bit line final-read voltage $V_{final, rd}$ by the current of the selected floating-gate transistor at the intersection of bit line BL(1) and word line WL(1). If the selected floating-gate transistor is in a programmed stated (e.g., a logical value of "0"), the selected BL(1) should remain at the bit line initial-read voltage $V_{init, rd}$. If the selected floating-gate transistor is in an erased stated (e.g., a logical value of "1"), the selected BL(1) should be discharged to the bit line final-read voltage $V_{final, rd}$. As will be appreciated, the difference between bit line initial-read voltage $V_{init, rd}$ and the bit line final-read voltage $V_{final, rd}$ (e.g., $V_{init, rd}-V_{final, rd}$) for the selected bit line BL(1) is generally referred to as "the range of bit line travel."

As previously described, it may be desirable to make the program-verify operation 62 more sensitive to residual cell current than in read operations. Accordingly, as previously described, one or more embodiments of the present technique may utilize a range of bit line travel (i.e., $V_{init, vfy}-V_{final, vfy}$) for the program-verify operation 62 that is lower than the range of bit line travel (i.e., $V_{init, rd}-V_{final, rd}$) for the read operation. In addition, as previously described, one or more embodiments of the present invention may utilize a sensing delay $t_{sense, vfy}$ for the program-verify operation 62 that is greater than the sensing delay $t_{sense, rd}$ utilized in the read operation. As will be appreciated, the time allowed for the bit-line discharge in the read operation is commonly referred to as "the read sensing delay" $t_{sense, rd}$.

As indicated in block 84, a read pass-through voltage $V_{pass, rd}$ is applied to the source select line GS(S) and the drain select line GS(D). Accordingly, the read pass-through voltage $V_{pass, rd}$ is applied to each source select gate 60 and each drain select gate 58. As described above, the source select gates 60 and drain select gates 58 may each comprise a FET. The read pass-through voltage $V_{pass, rd}$ should place the FET's in the source select gates 60 and the drain select gates 58 in an "on" state so that the FET's are operated as pass transistors. In general, the read pass-through voltage $V_{pass, rd}$ may range from 3 to 8V with a range of from 4.5 to 6.5V being typical. As will be appreciated, the present technique also encompasses read pass-through voltages outside of the listed range depending, for example, on the particular application and configuration of the transistor.

As indicated in block 86, a read pass-through voltage $V_{pass, rd}$ is applied to the word lines WL(0), WL(2)-WL(M) (referred to hereafter as "the unselected word lines"). As illustrated in FIG. 7, the unselected word lines WL(0), WL(2)-WL(M) are coupled to the unselected floating-gate transistors (i.e., the rows of the floating-gate transistors 54 that do not contain the selected floating-gate transistors). The read pass-through voltage $V_{pass, rd}$ should place the unselected floating-gate transistors in an "on" state regardless of their programmed state. In other words, the unselected floating-gate transistors are operated as pass transistors that pass current unrestricted by their programmed or unprogrammed threshold voltage. As previously described, the verify pass-through voltage $V_{pass, vfy}$ is greater than the read pass-through voltage $V_{pass, rd}$ that is applied during read operations. In general, the read pass-through voltage $V_{pass, rd}$ may range from 3 to 8V with a range of from 4 to 6V being typical. As will be appreciated, the present technique also encompasses read pass-through voltages outside of the listed range depending, for example, on the particular application.

As indicated in block 88, a read voltage $V_{rd}$ is applied to the selected word line WL(1). As the selected word line WL(1) is coupled to the control gate of the selected floating-gate transistors and, the read voltage $V_{rd}$ is applied to the control gate of the selected floating-gate transistors through the selected word line WL(1). As illustrated in FIG. 7, the floating-gate transistor 54 at the intersection of word line WL(1) and bit line BL(1) has been selected. The read voltage $V_{rd}$ is typically a voltage that allows the programmed state of the selected floating-gate transistors to affect the amount of current flow through the selected floating-gate transistors. For example, the read voltage $V_{rd}$ may range from 0 to 7V with a range from 0 to 4V being typical. As will be appreciated, the present technique also encompasses read voltages outside of the listed range depending, for example, on the particular application configuration of the transistor. Because the unselected floating-gate transistors are typically operated to pass current unrestricted by their programmed state, the programmed state of the selected floating-gate transistor will determine the amount of current the particular NAND memory string 56 passes from the selected bit line BL(1) in the read operation 76.

While the preceding discussion has described one or more embodiments of the present invention with respect to flash-memory cells, one or more embodiments may be applicable to other types of memory cells. For example, one or more of the embodiments described herein may be employed in SONOS memory cells, such as a SONOS NAND memory array. In one or more embodiments, a voltage may be applied to unselected rows in a SONOS NAND memory array during program-verify operations that is greater than a voltage applied in read operations.

While embodiments of the invention may be susceptible to various modifications and alternative forms, specific embodiments have been shown by way of example in the drawings and have been described in detail herein. However, it should be understood that the invention is not intended to be limited to the particular forms disclosed. Rather, embodiments of the invention are to cover all modifications, equivalents, and alternatives falling within the spirit and scope of these embodiments, as defined by the following appended claims.

What is claimed is:

1. A method comprising:
    applying an initial verify voltage to an access line of one or more selected memory cells;
    applying a verify pass-through voltage to control gates of unselected memory cells;
    applying an initial read voltage to the access line of the one or more selected memory cells, wherein a difference between the initial verify voltage and a final verify voltage is lower than a difference between the initial read voltage and a final read voltage; and
    applying a read pass-through voltage to control gates of unselected memory cells, wherein the verify pass-through voltage is greater than the read pass-through voltage.

2. The method of claim 1, wherein applying the initial verify voltage comprises adjusting the initial verify voltage such that the difference between the initial verify voltage and the final verify voltage is lower than the difference between the initial read voltage and the final read voltage.

3. The method of claim 1, comprising adjusting the final verify voltage such that the difference between the initial verify voltage and the final verify voltage is lower than the difference between the initial read voltage and the final read voltage.

4. The method of claim 1, wherein the difference between the initial verify voltage and the final verify voltage is at least approximately 0.2 V lower than the difference between the initial read voltage and the final read voltage.

5. The method of claim 1, wherein a sensing delay for discharge of the initial verify voltage for a verifying operation is greater than a sensing delay for discharge of the initial read voltage during a read operation.

6. The method of claim 5, wherein the sensing delay is at least 2 microseconds greater for the verifying operation than for the read operation.

7. The method of claim 5, comprising adjusting the sensing delay for the verifying operation.

8. A method comprising:
    applying an initial verify voltage to an access line coupled to a selected memory cell;
    sensing a final verify voltage of the access line at a verify sensing time;
    applying an initial read voltage to the access line;
    sensing a final read voltage of the access line at a read sensing time, wherein the verify sensing time is greater than the read sensing time.

9. The method of claim 8, wherein the verify sensing time is approximately 2 microseconds or more greater than the read sensing time.

10. The method of claim 8, wherein one or more of the initial verify voltage and the initial read voltage is adjustable.

11. The method of claim 8, wherein a difference between the initial verify voltage and the final verify voltage is lower than a difference between the initial read voltage and the final read voltage.

12. The method of claim 11, wherein the difference between the initial verify voltage and the final verify voltage is at least approximately 0.2 V lower than the difference between the initial read voltage and the final read voltage.

13. The method of claim 8, comprising:
    applying a verify pass-through voltage to control gates of unselected memory cells; and
    applying a read pass-through voltage to control gates of unselected memory cells.

14. The method of claim 13, wherein the verify pass-through voltage is greater than the read pass-through voltage.

15. A device comprising:
    a plurality of memory cells each of the memory cells being coupled to one of a plurality of select lines and one of a plurality of access lines; and
    a control circuit operable to control application of voltage to the select lines and the access lines during program-verify and read operations, wherein the control circuit is operable to apply an initial verify voltage to an access line during the program-verify operations and sense a final verify voltage at a verify sensing time, wherein the control circuit is operable to apply an initial read voltage to the access lines during the read operations and sense a final read voltage at a read sensing time, and wherein the control circuit is operable to adjust one or more of the initial verify voltage, the initial read voltage, the verify sensing time, and the read sensing time such that a current for verifying whether one of the plurality of memory cells has been programmed to a state is less during the program-verify operation than during the read operation.

16. The device of claim 15, wherein a difference between the initial verify voltage and the final verify voltage is lower than a difference between the initial read voltage and the final read voltage.

17. The device of claim 16, wherein the difference between the initial verify voltage and the final verify voltage is approximately 0.2V lower than the difference between the initial read voltage and the final read voltage.

18. The device of claim 15, wherein the verify sensing time is approximately 2 microseconds or more greater than the read sensing time.

19. The device of claim 15, wherein the control circuit is further operable to apply a verify pass-through voltage to unselected select lines during the program verify operations and apply a read pass-through voltage to unselected select lines during the read operations, wherein the verify pass-through voltage is greater than the read pass-through voltage.

* * * * *